United States Patent [19]

Huang et al.

[11] Patent Number: 5,866,922
[45] Date of Patent: Feb. 2, 1999

[54] COLOR DISPLAY WITH INTEGRATED SEMICONDUCTOR LEDS AND ORGANIC ELECTROLUMINESCENT DEVICES

[75] Inventors: Rong Ting Huang, Gilbert; Phil Wright, Scottsdale; Paige M. Holm; Song Q. Shi, both of Phoenix, all of Ariz.

[73] Assignee: Motorola, Inc., Schaumburg, Ill.

[21] Appl. No.: 772,448

[22] Filed: Dec. 23, 1996

[51] Int. Cl.$^6$ .......................... H01L 33/00; H05B 33/00; H05B 33/06

[52] U.S. Cl. .................. 257/93; 257/89; 257/90; 257/103; 257/40

[58] Field of Search .................. 257/89, 90, 93, 257/103, 40

[56] References Cited

U.S. PATENT DOCUMENTS

| | | | |
|---|---|---|---|
| 5,424,560 | 6/1995 | Norman | 257/89 |
| 5,491,349 | 2/1996 | Komoto | 257/89 |
| 5,583,349 | 12/1996 | Norman | 257/89 |
| 5,693,962 | 12/1997 | Shi | 257/89 |

*Primary Examiner*—Jerome Jackson
*Attorney, Agent, or Firm*—Eugene A. Parsons

[57] ABSTRACT

An integrated matrix of light emitting devices includes a plurality of isolated semiconductor LEDs positioned in a matrix of rows and columns on the surface of a substrate. A plurality of column buses, one each positioned adjacent each column of semiconductor LEDs, is provided with each of the column buses being connected to a first terminal of each semiconductor LED in the adjacent column of semiconductor LEDs and each of the column buses providing an exposed planar surface. A plurality of OEDs is positioned on the exposed planar surface of each column bus with a first terminal of each OED connected to the column bus.

8 Claims, 8 Drawing Sheets

*FIG. 9*
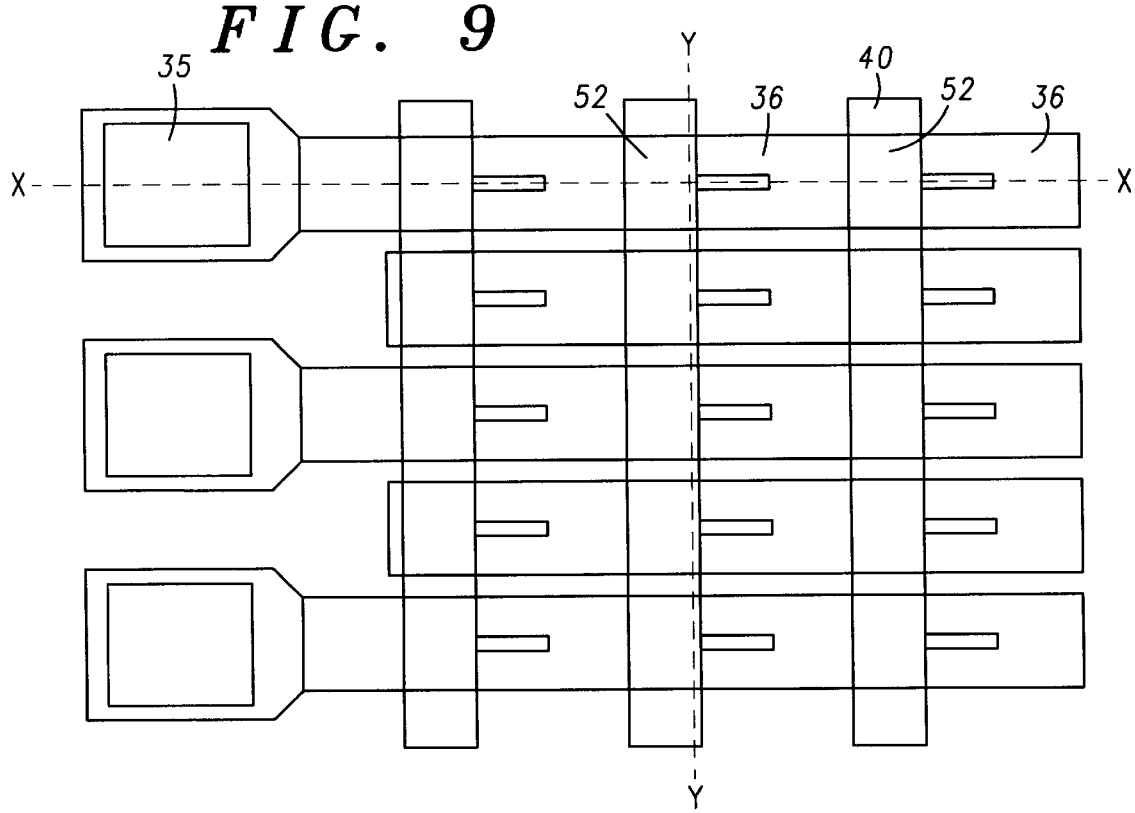
*FIG. 10*
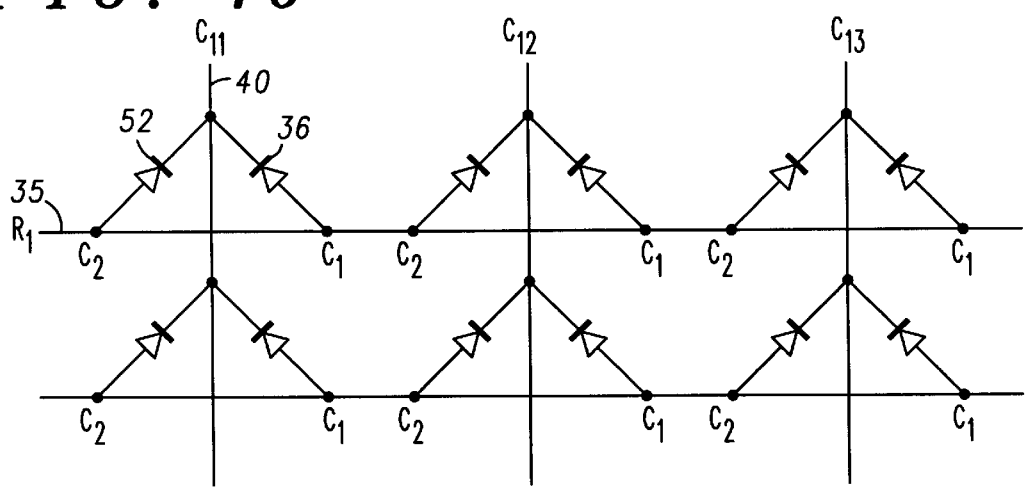
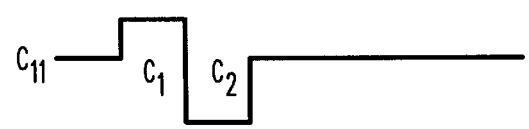
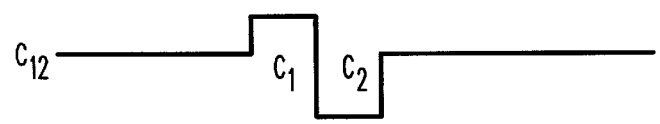
*FIG. 11*

FIG. 16
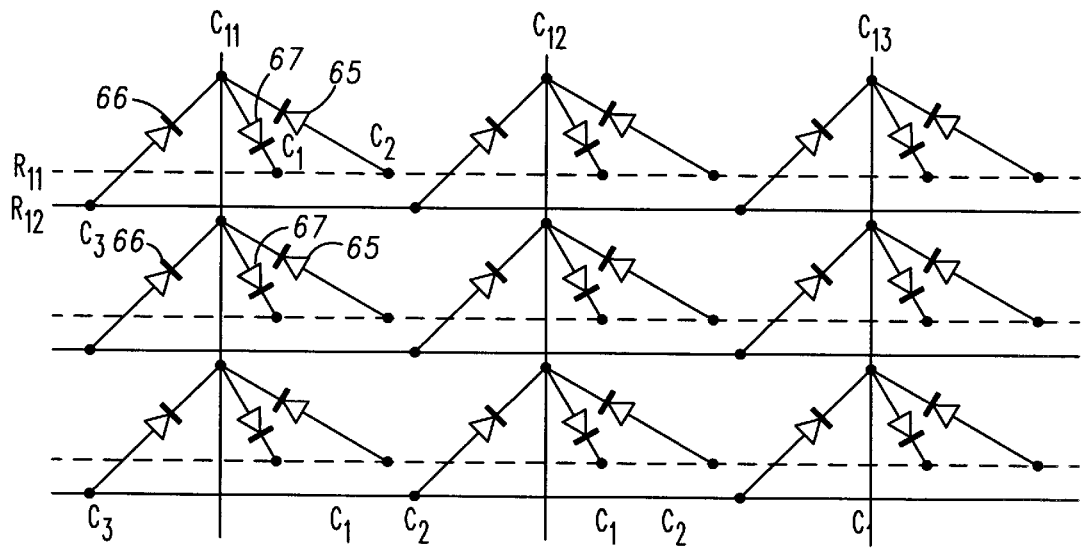
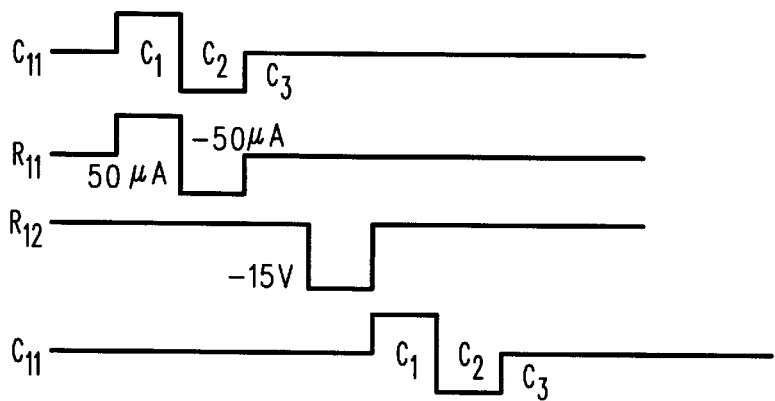
FIG. 17

COLOR DISPLAY WITH INTEGRATED SEMICONDUCTOR LEDS AND ORGANIC ELECTROLUMINESCENT DEVICES

FIELD OF THE INVENTION

The present invention pertains to light emitting device arrays and more specifically to light emitting device arrays having an improved fill factor.

BACKGROUND OF THE INVENTION

Two dimensional arrays of visible light emitting devices, such as light emitting diodes (LEDs), are becoming very useful in displays for portable electronic devices, such as telephones, cellular telephones, two-way radios, pagers, etc. Generally, these two dimensional arrays include large numbers of light emitting devices, from 5000 to 80,000 or more, with a specific example being 144 rows by 240 columns.

One important factor in the quality of an image viewed on a given display, whether real or virtual, is the fill factor of the pixels within the emitting area. A high fill factor is desirable to obtain high quality images. For CRTs, the emission profiles of adjacent pixels actually overlap giving effective fill factors greater than unity, and producing a very smooth (not grainy) image. With matrix LED displays, however, it is not possible to achieve unity fill factors since there needs to be isolation between pixels. In addition, since conventional row/column matrix addressing schemes use metal row and column interconnects, there needs to be room for the column and row interconnect busses to pass through the pixel and to make contact to each electrode of the diode making up the pixel. For the columns, this interconnect component turns out to be the major component in the space required between pixels because of the minimum line width and alignment tolerances associated with this interconnect bus/contact processing.

In U.S. Pat. No. 5,483,085, entitled "Electro-optic Integrated Circuit and Method of Fabrication", issued Jan. 9, 1996, and assigned to the same assignee, a method of fabricating LED arrays is disclosed utilizing implant technology for isolation and separation. As can be seen in the figures of the '085 Patent, one minimum dimension is needed for isolation, another for the column bus/cathode contact, and two alignment tolerances for placement of the metal. Generally, utilizing the present semiconductor fabrication techniques, 2 micron minimum line widths, spaces and alignment tolerances together with a 10 micron emission square for each diode give a minimum linear fill factor of 0.5 or an area fill factor of $(0.5)^2=0.25$. The images produced by this display can be somewhat grainy as a result of this relatively low fill factor.

Another problem that is prevalent in the industry at the present time is the limitation on colors of LEDs that are available and/or practically manufacturable. When producing a full color display, for example, the three basic colors, red, green and blue, must be available. In many instances the colors generated by LEDs fabricated on one material system are far from the primary colors, resulting in less than desirable displays.

Accordingly, it is highly desirable to provide light emitting device arrays which overcome these problems.

It is a purpose of the present invention to provide new and improved light emitting device arrays.

It is another purpose of the present invention to provide new and improved light emitting device arrays with a substantially improved fill factor.

It is another purpose of the present invention to provide new and improved light emitting device arrays which require the same semiconductor chip area as prior arrays, for larger numbers of light emitting devices.

It is still another purpose of the present invention to provide new and improved light emitting device arrays with substantially improved color.

It is a further purpose of the present invention to provide a new and improved method of fabricating light emitting device arrays.

It is a still further purpose of the present invention to provide a new and improved method of fabricating light emitting device arrays which is simpler and more efficient than prior methods and which is easily adaptable to high production levels.

SUMMARY OF THE INVENTION

The above problems and others are at least partially solved and the above purposes and others are realized in an integrated matrix of light emitting devices including a plurality of isolated semiconductor light emitting diodes positioned in a matrix of rows and columns on a substrate with a plurality of column buses, one each positioned adjacent each column of semiconductor light emitting diodes, each of the column buses being connected to a first terminal of each semiconductor light emitting diode in the adjacent column of semiconductor light emitting diodes, and each of the column buses providing an exposed planar surface. The integrated matrix of light emitting devices further includes a plurality of organic electroluminescent devices positioned on the planar surface of each column bus with a first terminal of each organic electroluminescent device connected to the column bus.

The above problems and others are at least partially solved and the above purposes and others are further realized in a method of fabricating an integrated matrix of light emitting devices including the steps of providing a substrate with a major surface, forming a plurality of layers of semiconductor material on the substrate including at least a conductive layer of material supported by the major surface of the substrate, a first carrier confinement layer on the conductive layer, an active layer on the first carrier confinement layer, and a second carrier confinement layer on the active layer, implanting impurities in the plurality of layers of material to separate the plurality of layers of material into a plurality of isolated semiconductor light emitting diodes positioned in a matrix of rows and columns with each semiconductor light emitting diode having a first terminal in contact with the conductive layer and a surface terminal, and positioning conductive material on a surface of the plurality of layers of semiconductor material to form a plurality of column buses, one each positioned adjacent each column of semiconductor light emitting diodes, further positioning the column buses so as to connect each of the column buses to the surface terminal of each semiconductor light emitting diode in the adjacent column of semiconductor light emitting diodes, each of the column buses providing a planar surface. A layer of dielectric material is then positioned over the plurality of isolated semiconductor light emitting diodes and patterning the layer of dielectric material to define trenches therein so as to expose portions of each of the plurality of column buses, and a plurality of organic electroluminescent devices are formed in the trenches and on the planar surface of each column bus with a first terminal of each organic electroluminescent device being connected to the column bus.

BRIEF DESCRIPTION OF THE DRAWINGS

Referring to the drawings:

FIG. 9 is a view in top plan of a portion of the integrated matrix of light emitting devices illustrated in FIG. 8;

FIG. 10 is a schematic representation of the integrated matrix of light emitting devices illustrated in FIG. 8;

FIG. 11 is a portion of a simplified timing diagram for the operation of the integrated matrix of light emitting devices illustrated schematically in FIG. 10;

FIG. 16 is a schematic representation of the integrated matrix of light emitting devices illustrated in either of FIG. 15; and FIG. 17 is a portion of a simplified timing diagram for the operation of the integrated matrix of light emitting devices illustrated schematically in FIG. 16.

DESCRIPTION OF THE PREFERRED EMBODIMENTS

Figure 1:
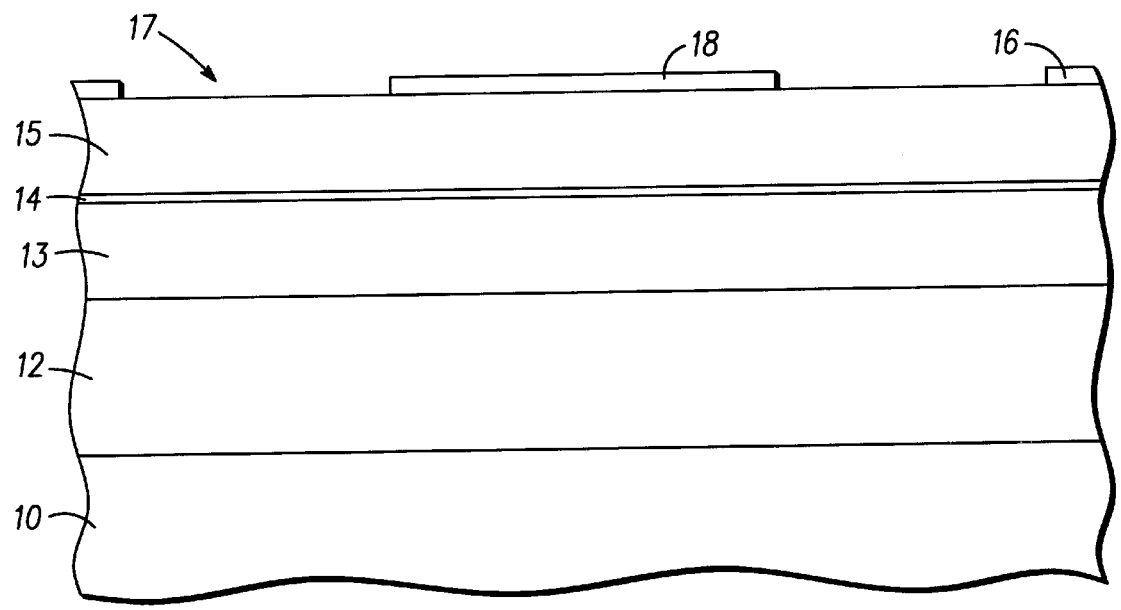
FIGS. 1–5 are simplified cross-sectional views illustrating sequential steps in the fabrication of an implanted semiconductor light emitting diode array in accordance with the present invention.

A simplified cross-sectional view of an intermediate structure realized in the fabrication of an implanted semiconductor light emitting diode array is illustrated in FIG. 1. The structure includes a substrate 10 having a heavily doped conductive layer 12 formed thereon. A first carrier confinement layer 13, an active layer 14 and a second carrier confinement layer 15 are formed on conductive layer 12 using any known method. Carrier confinement layer 13, active layer 14 and carrier confinement layer 15 are the materials which are eventually separated into a plurality of semiconductor light emitting diodes. A conductive cap layer 16 is formed on second confinement layer 15. Conductive layer 12 and cap layer 16 provide electrical contacts to opposite sides of the light emitting diodes.

In a specific example, substrate 10 is formed of undoped gallium arsenide (GaAs) to form a semi-insulating semiconductor. Conductive layer 12 is a relatively heavily doped layer of GaAs epitaxially grown on the surface of substrate 10. Carrier confinement layer 13 is an epitaxially grown layer of aluminum-gallium-indium-phosphide (AlGaInP) doped to provide N-type semiconductivity. Active layer 14 is an epitaxially grown layer of AlGaInP formed in a manner well known in the art so that further description is believed to be unnecessary. Carrier confinement layer 15 is an epitaxially grown layer of AlGaInP doped to provide P-type semiconductivity. Cap layer 16 is an epitaxially grown layer of GaAs heavily doped to provide P-type conductivity. It will of course be understood that the various layers can be provided in many other forms and the present embodiment is disclosed because of the simplicity of formation. Also, in some embodiments additional layers are provided for various special applications and it should be understood that the disclosed structure is intended as a basic structure for purposes of this disclosure and not as a limitation. Cap layer 16 is selectively formed on carrier confinement layer 15 by any of several well known methods. For example, cap layer 16 is epitaxially grown as a blanket layer and areas 17 are removed by some convenient method such as etching to expose the surface of carrier confinement layer 15. In the present embodiment, cap layer 16 is epitaxially grown as a blanket layer and areas 17 are removed by etching, utilizing a mask (not shown) which mask is subsequently also utilized for implanting, as will be apparent presently. The exposed areas of carrier confinement layer 15 define exposed row areas and exposed column areas so as to divide the remaining portions of cap layer 16 into a matrix of diode light emitting areas 18.

Throughout this description references to rows and columns are made for simplicity of the disclosure but it will be understood by those skilled in the art that these terms are completely interchangeable since rows and columns of a matrix generally depend upon a physical orientation. Reference to the top plan view of FIG. 6 during this description will aid in an understanding of the structure. It will of course be understood that cap layer 16 could also be selectively grown or deposited by masking the surface of carrier confinement layer 15. In either method, the cap layer does not significantly alter the planarity of the process since it is only on the order of 500 angstroms thick.

Figure 2:
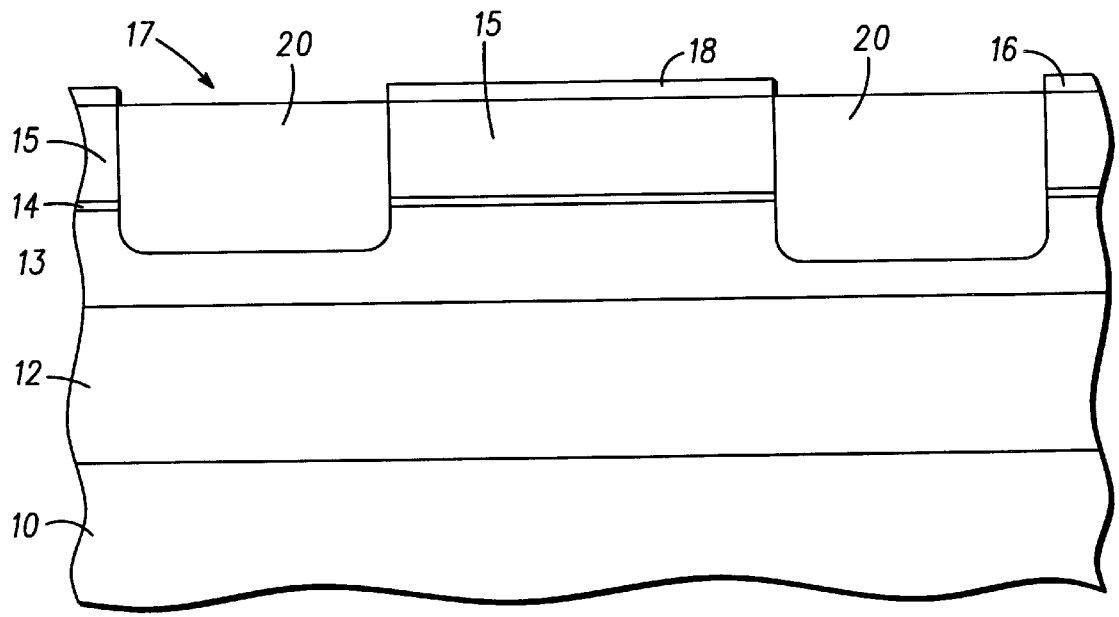

Referring to FIG. 2, a plurality of surface contacts to conductive layer 12 are formed by converting a vertical pillar 20 of P-type semiconductive material in carrier confinement layer 15 and the material of active layer 14 to heavily doped N-type conductive material. The conversion is accomplished by implanting an impurity in the exposed row areas 17 at the predetermined positions of vertical pillars 20. In this embodiment the surface contacts are formed in rows and a surface contact is provided for each semiconductor light emitting diode in each row, to reduce the resistance of the connections to the lower contact of each semiconductor light emitting diode. It should be understood, however, that some or all of the intermediate vertical pillars could be eliminated and row connections could be made by connections (vertical pillars 20) to conductive layer 12 at predetermined positions in each row or, for example, only at the ends of each row.

In a specific example, vertical pillars 20 are formed by using standard ion implant and implanting mask technology. Donor ions of silicon, Si+, are used but it will be understood that any known donor in this material system (e.g. Se, Te, etc.) could be utilized. Typically, manufacturing fabs are equipped with ion implanters having maximum accelerating voltages of 200 KeV. The projected range of doubly ionized Si ions at this energy is about 0.35 microns which limits the combined thickness of layers 15 and 14 to approximately 0.35 microns. It is, therefore, advantageous to remove the overlying portions (17) of cap layer 16 prior to the implanting step to maximize the implant depth. The implant dose must be sufficient to convert pillars 20 down through layers 15 and 14 to a conductor. To accomplish the conversion, the implant dose, in one embodiment, is in the range of $10^{14}$ per $cm^2$. A photoresist layer approximately 2.5 microns thick, formed into an implant mask in the usual manner, is sufficient to restrict the implant to vertical pillars 20.

Once the implant of vertical pillars 20 has been completed, the implant is activated with a high temperature anneal. Generally, because of the depth and dosage of the implant, the high temperature anneal requires a temperature in the range of approximately 800° C. to 900° C. The implant of vertical pillars 20 is generally a first step in the process sequence, because subsequent implant and metallization steps (to be explained) generally cannot tolerate this high temperature.

Figure 3:
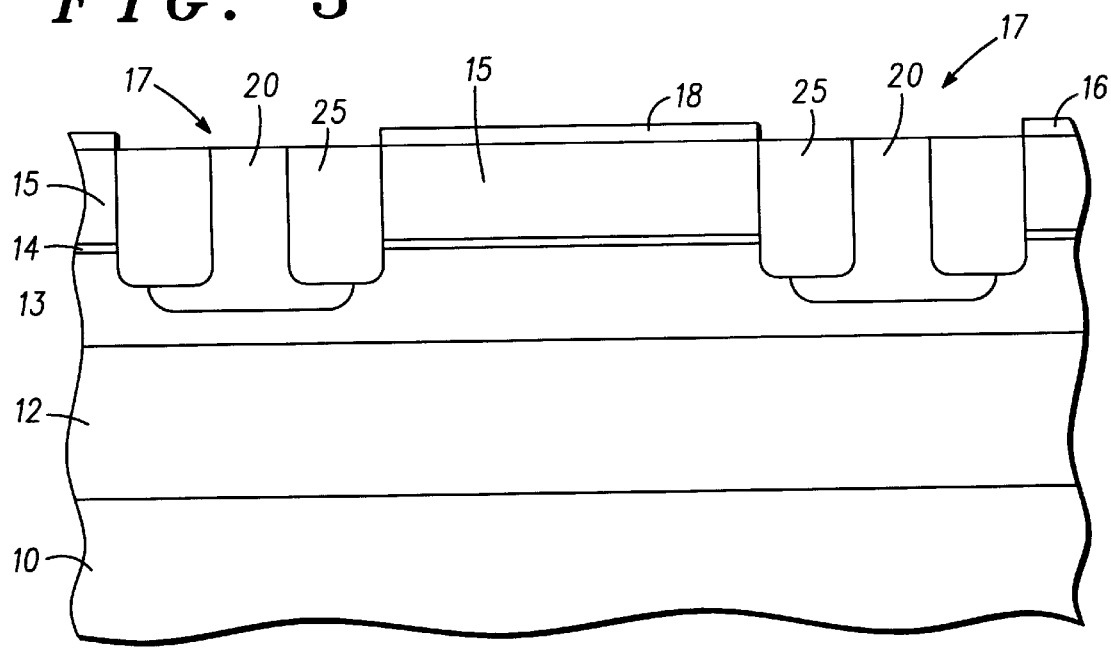

Referring to FIG. 3, confinement or isolation of each semiconductor light emitting diode is achieved by implanting impurity material to form an isolating resistive volume, or moat 25, around each of the defined light emitting areas 18. Resistive moat 25 laterally confines current flow across the P-N junction (carrier confinement layer 15, active layer 14 and carrier confinement layer 13) of each of the semiconductor light emitting diodes and, therefore, defines the emitting region of each of the semiconductor light emitting diodes. The depth of moat 25 ranges from zero depth, in which only cap layer 16 is etched, to well into carrier confinement layer 13, depending upon the desired level of current confinement and the potential negative effects resulting from implanting through the P-N junction of the semiconductor light emitting diodes (e.g. reliability issues). Corresponding implant energies range from 0 to approximately 200 KeV.

In a specific example, oxygen ions, O+, are utilized as the implanted impurity. It will be understood, however, that many other species including hydrogen (H+), boron (B+), helium (He+), etc. are known to produce resistive regions also. The implant dosage required for adequate isolation varies with the selected implant depth, but is typically in the range of $10^{12}$ to $10^{13}$ per $cm^2$. Generally, a photoresist layer approximately 2.0 microns thick, formed into an implant mask in the usual manner, is sufficient to restrict the implant to moat 25 surrounding each light emitting area 18. It should be understood that cap layer 16 is generally removed to form exposed areas 17 prior to this implant step because it is very difficult (there is no known implant process at this time) to make cap layer 16 highly resistive. As explained above, removal of cap layer 16 does not significantly effect the planarity of the structure because it is only approximately 500 angstroms thick. It should be noted that resistive moat 25 also acts to eliminate any parasitic, implanted P-N junctions at the interface between each semiconductor light emitting diode (P-type carrier confinement layer 15) and N-type vertical pillars 20.

In the present embodiment, the exposed row areas and exposed column areas define a matrix of semiconductor diode light emitting areas 18, which may, for example, contain as many as 200 or 300 columns and 100 or 200 rows of semiconductor light emitting diodes, or in some special applications even more. Also, in the described embodiment carrier confinement layer 13 and conductive layer 12 are common to each semiconductor light emitting diode. This allows the lower terminals (carrier confinement layer 13) of each of the semiconductor light emitting diodes in each row to be conveniently connected in common. However, in this embodiment it is necessary to isolate the rows of semiconductor light emitting diodes from each other to prevent crosstalk therebetween.

Figure 4:
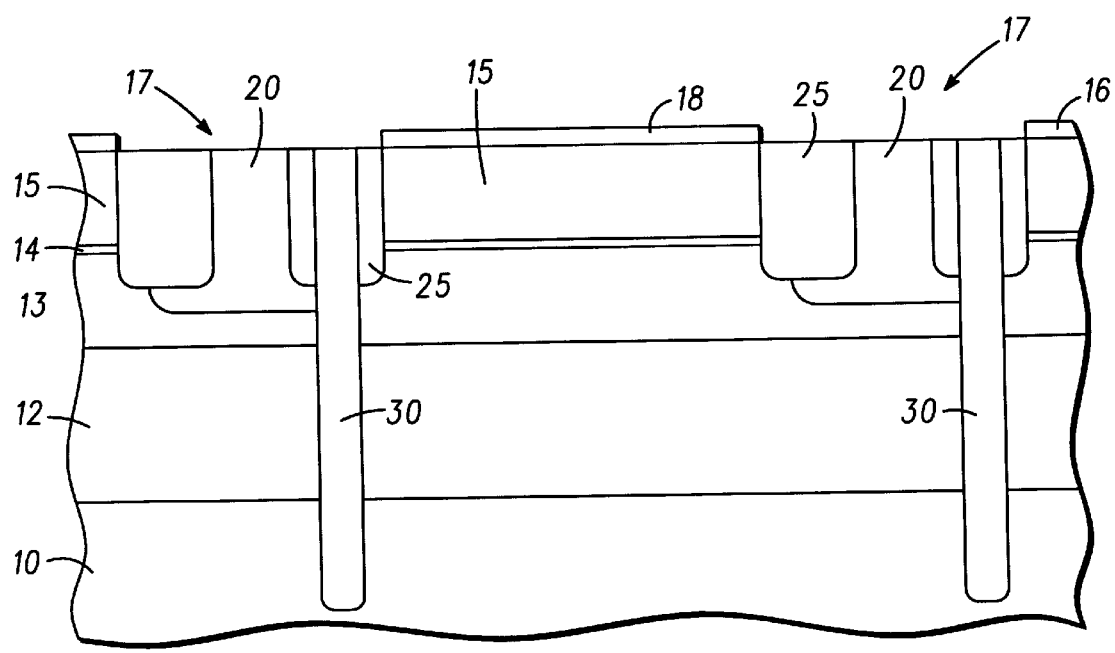

Referring to FIG. 4, in this specific embodiment the isolation is provided by an isolation implant 30 extending like a substantially continuous wall between each adjacent pair of rows of semiconductor light emitting diodes. Further, implant 30 extends downwardly through carrier confinement layer 15, active layer 14, carrier confinement layer 13 and conductive layer 12 to electrically isolate adjacent rows from each other. In the specific embodiment illustrated in FIGS. 1–4, isolation implant 30 need only isolate the N-type layers (carrier confinement layer 13 and conductive layer 12) into rows, since resistive moat 25 isolates the P-type layers (carrier confinement layer 15 and active layer 14). In other embodiments, where resistive moat 25 is very thin vertically, it may be necessary that isolation implant 30 isolate P-type layers as well.

In a specific example, doubly ionized oxygen ions, O++, are used as the impurity because it allows a minimum implant mask thickness and oxygen implanted GaAs layers retain their resistive properties even after moderate temperature cycling. Since isolation implant 30 must extend through conductive layer 12, the depth range of isolation implant 30 limits the overall thickness (illustrated as "d" in FIG. 5) of the structure (layers 12, 13, 14 and 15). Doubly ionized oxygen ions have a projected range of about 0.6 microns at 200 KeV. Other ions, such as hydrogen (H+), helium (He+), or boron(B+) may provide greater isolation depths, thereby allowing greater structure thicknesses. Implant doses of approximately $10^{13}$ per $cm^2$ to $10^{14}$ per $cm^2$ have been found to be adequate for the required isolation. A photoresist mask about 3 microns thick is adequate for the isolation implant step.

Figure 5:
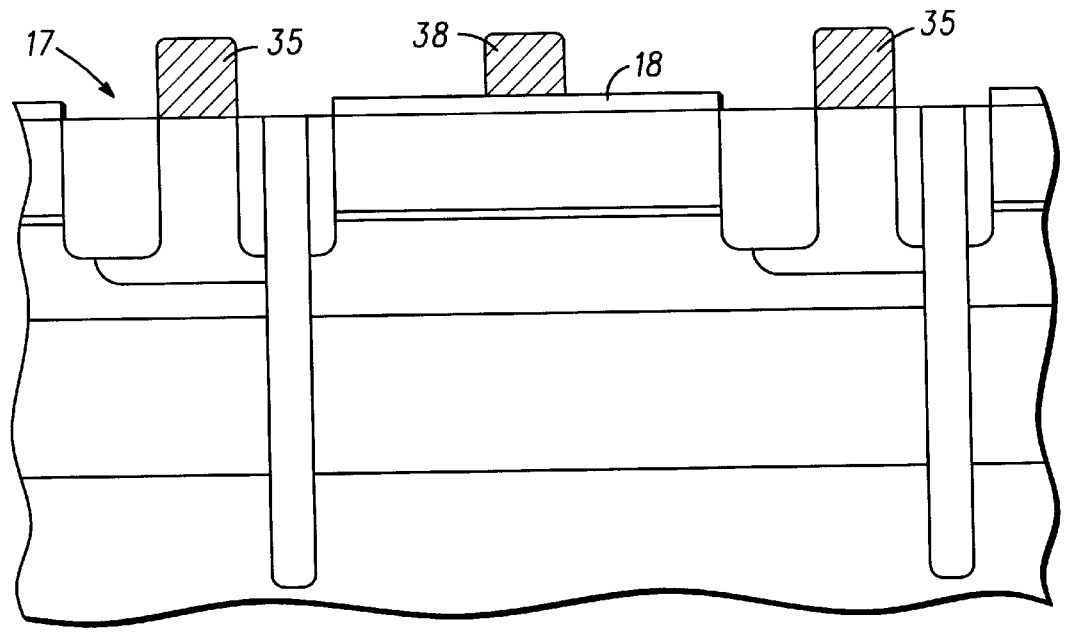
Figure 6:
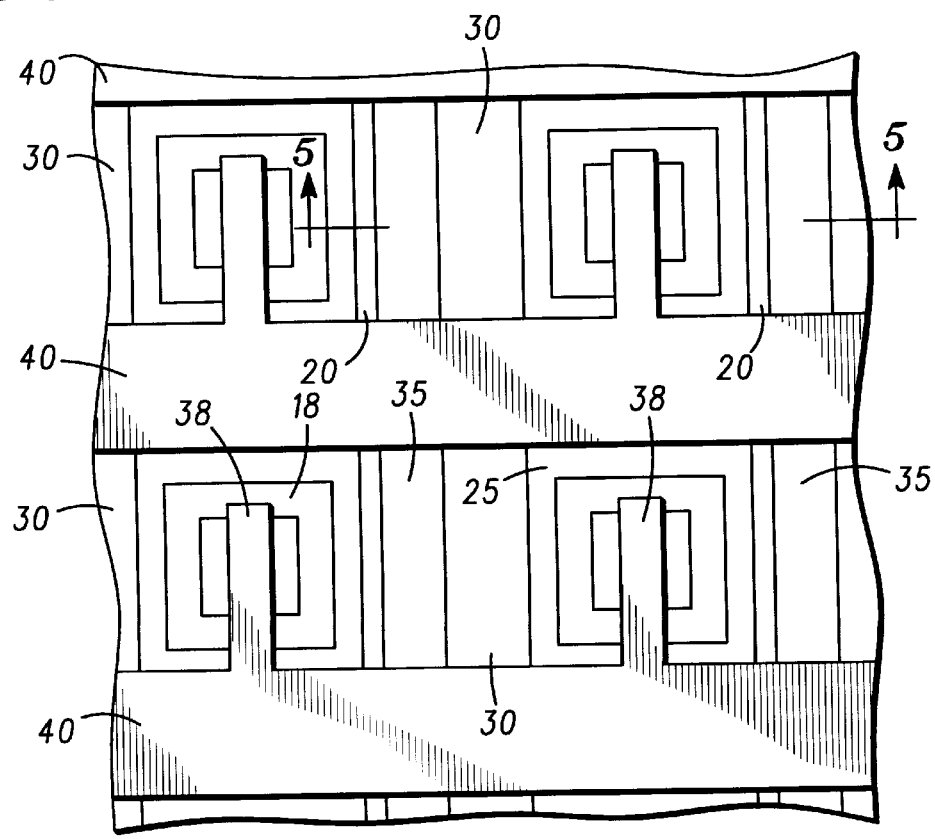
FIG. 6 is a view in top plan of an implanted semiconductor light emitting diode array, portions thereof broken away.

Referring to FIGS. 5 and 6, a semiconductor light emitting diode array is illustrated. FIG. 6 is a top plan with portions thereof broken away and FIG. 5 is a sectional view generally as seen from the line 5—5 of FIG. 6. Once the structure of FIG. 4 is completed the fabrication process includes forming N-type and P-type ohmic contacts to each semiconductor light emitting diode, applying interlayer dielectric with contact vias and patterning interconnect metallization. Generally, these steps can be performed by standard silicon and GaAs integrated circuit fabrication processes. In this specific example, the plurality of surface contacts formed by conductive vertical pillars 20 are connected into rows by row busses 35. The row busses 35 are N-contact metal, for example NiGeAu liftoff approximately 4000 angstroms thick, applied with an appropriate photoresist pattern, and alloyed at a temperature of approximately 460° C. Thus, the lower terminal of each semiconductor light emitting diode, which in this embodiment is the cathode, in each row is connected to the lower terminal of each other semiconductor light emitting diode in the row and to an external connection pad (not shown).

Similarly, the upper terminal of each semiconductor diode (light emitting area 18 of cap layer 16) in each column is connected by a connection 38 to a column bus 40 (see FIG. 6). Column busses 40 and connections 38 are P-contact metal, for example AlCu liftoff approximately 7000 angstroms thick, applied with an appropriate photoresist pattern, and alloyed at a temperature of approximately 250° C. Also, for purposes that will be explained presently, a thin layer of MgLi or AlLi is formed on the upper surface of column buses 40 (illustrated in FIG. 8). Thus. the upper terminal of each light emitting diode in a column is connected to the upper terminal of each other light emitting diode in the column. As illustrated in FIG. 5, in the specific example, light emitting area 18 of each light emitting diode is approximately square with a dimension $W_1$ of approximately 10 microns. The row and column areas 17 between light emitting areas 18 of the light emitting diodes, both of which are approximately equal, have widths, $W_2$, which is less than approximately 10 microns. Thus, approximately 25% of the surface of the structure is light emitting.

Additional information on an implant type of light emitting diode array and methods of fabrication is available in a U.S. Pat. No. 5,453,386. entitled "METHOD OF FABRICATION OF IMPLANTED LED ARRAY", issued Sep. 26, 1995 and assigned to the same assignee.

Figure 7:
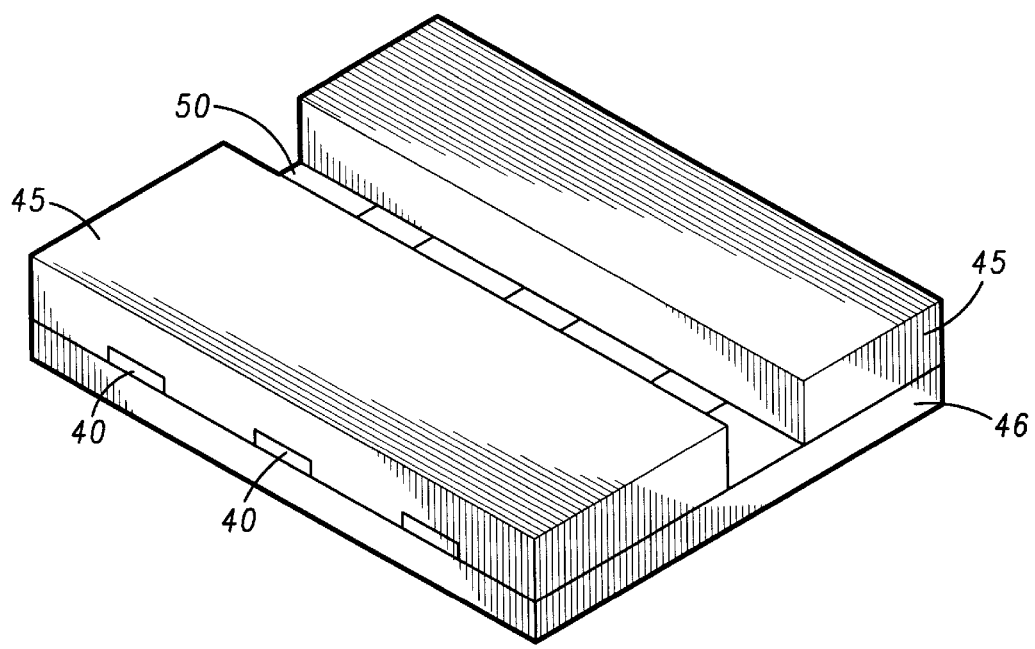
FIG. 7 is simplified isometric view of a portion of the semiconductor light emitting diode array of FIG. 6, illustrating another step in a fabrication process in accordance with the present invention.

Turning now to FIG. 7, a dielectric layer 45 of $SiO_2$ and/or SiN is positioned on the surface of the semiconductor light emitting diode array (designated 46 and illustrated as a single layer for convenience) illustrated in FIG. 6. Dielectric layer 45 passivates semiconductor light emitting diode array 46 and electrically separates the metallization forming row buses 35 from connections 38 and column busses 40. In this embodiment, dielectric layer 45 is deposited in a blanket layer and patterned to define trenches 50 therein so as to expose portions of each of the plurality of column buses 40. It should be understood that FIG. 7 is not drawn to scale but is exaggerated to make trenches 50 more prominent for a better understanding of the remainder of the fabrication process. Further, while the embodiment illustrated in FIG. 7 shows trenches 50 extending perpendicular to column buses 40, it will be understood that dielectric layer 45 can also be patterned so that trenches 50 overlie and are generally coextensive with column buses 40. In this embodiment a column of organic electroluminescent devices is formed in each trench 50, rather than a row of organic electroluminescent devices. Also, it should be understood that dielectric layer 45 can be deposited using a number of different techniques, including sputtering, spin-on, etc.

Figure 8:
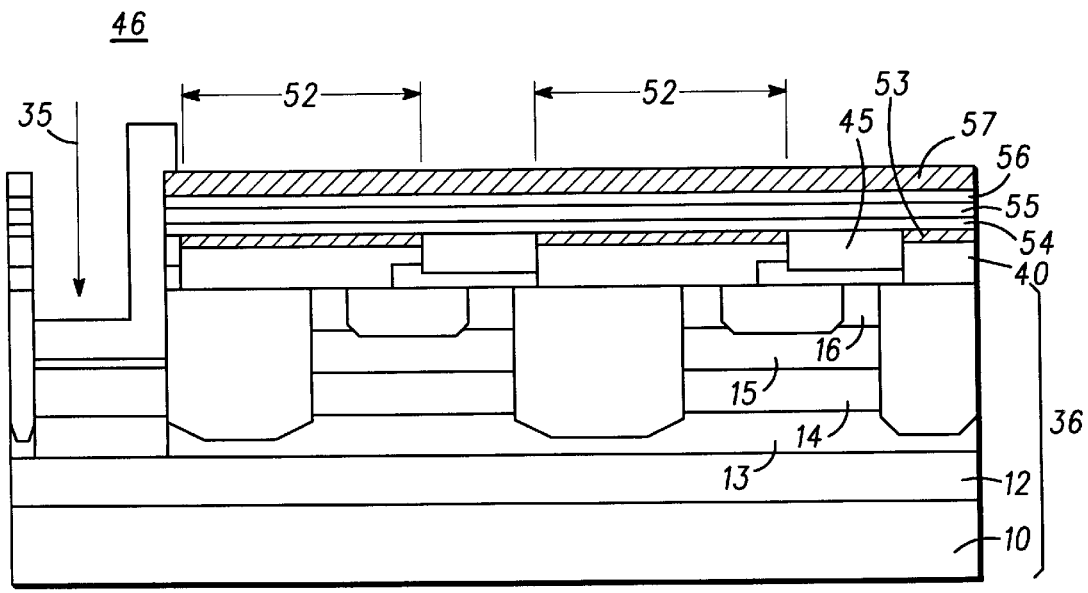
FIG. 8 is a simplified cross-sectional view of an integrated matrix of light emitting devices in accordance with the present invention.

Referring to FIG. 8, semiconductor light emitting diode array 46 is illustrated in some detail with portions of dielectric layer 45 isolating adjacent semiconductor light emitting diode contacts and defining, in conjunction with column buses 40, a relatively planar surface on the bottom of trenches 50. Material is deposited in trenches 50 to form organic electroluminescent devices, at least one in conjunction with each semiconductor diode in semiconductor light emitting diode array 46. In FIG. 8, which only illustrates a portion of semiconductor light emitting diode array 46, an organic electroluminescent device 52 (also known as an organic light emitting diode) is illustrated.

Organic electroluminescent device 52 includes a conductive layer 53 which, in this embodiment, includes the thin layer of MgLi or AlLi formed on the upper surface of column buses 40. Conductive layer 53 is formed of any of a wide range of metals or alloys in which at least one metal has a work function less than 4.0 eV. By the proper selection of material for conductive layer 53, the work functions of materials making up layer 53 are substantially matched to reduce the required operating voltage and improve the efficiency of organic electroluminescent device 52.

An electron transporting zone 54 made of an electron transporting material is deposited on the surface of conductive layer 53 and a light emission zone 55, made of a host emissive material containing a guest fluorescent dopant, is deposited onto the surface of electron transporting zone 54. A hole transporting zone 56, made of organic hole transporting materials, is deposited on the surface of light emission zone 55. A transparent electrically conductive layer 57 is deposited on the surface of hole transporting zone 56 so as to form a relatively uniform electrical contact for all of organic electroluminescent devices 52 in a common row. It should be understood that the specific organic electroluminescent device described (i.e. hole transport layer, emitter, electron transport layer) is for purposes of explanation and a wide variety of devices can be incorporated. These include but are not limited to devices in which one or more of the described layers are omitted or additional layers are included and devices in which an electron transport layer and/or a hole transport layer performs at least a portion of the emission.

Here it should be noted that for convenience of fabrication layers 53–57 extend the length of each trench 50, but only the portion of layers 53–57 which lie between an energized column bus 40 and an energized conductive layer 57 will be activated to emit photons. Thus, each trench 50 includes a row of organic electroluminescent devices 52 (two can be seen in FIG. 8) equal in number to the number of column rows in semiconductor light emitting diode array 46.

In this embodiment conductive layer 53 is a p-type contact and conductive layer 57 is an n-type contact. A negative terminal of a potential source (not shown but generally understood to be a row driver) is connected to conductive layer 57 and a positive terminal is connected to conductive layer 53. When a potential is applied between layers 53 and 57 by means of the potential source, electrons injected from the n-type contact (layer 57) are transported through organic layer 56 and into organic layer 55 (the emissive layer) and holes injected from the p-type contact (layer 53) are transported through organic layer 54 and into organic layer 55 (the emissive layer), where upon an electron and a hole recombination a photon is emitted.

As illustrated in FIG. 9, each semiconductor light emitting diode 36 in semiconductor light emitting diode array 46 has an organic electroluminescent device 52 associated therewith to form a complete pixel. A schematic representation of the integrated matrix of light emitting devices is illustrated in FIG. 10. Each semiconductor light emitting diode 36 has an anode connected to a column bus 40 and a cathode connected to a row bus 35. The organic electroluminescent device 52 associated with each semiconductor light emitting diode 36 has an anode connected to the same row bus 35 and a cathode connected to the same column bus 40, so as to have a common address but a reverse polarized energization pulse, as illustrated in FIG. 11. Thus when a positive pulse (C1) is applied to column bus (C11), with row bus (R1) at a reference potential (grounded for example), semiconductor light emitting diode 36 is energized to emit light. By reversing the polarity, i.e. applying a negative pulse (C2) to column bus (C11), organic electroluminescent device 52 is energized to emit light.

Thus a two color integrated matrix of light emitting devices is disclosed which is relatively easy to manufacture and which has a reduced number of electrical connections so that fewer external terminals are required. Because organic electroluminescent devices are integrated on the same substrate with semiconductor light emitting devices, a wider range of colors is available. Also, as can be seen most clearly in FIG. 9, a much larger percentage of the surface of the structure is light emitting, so that the images produced by this display are much less grainy as a result of this relatively high fill factor.

Figure 12:
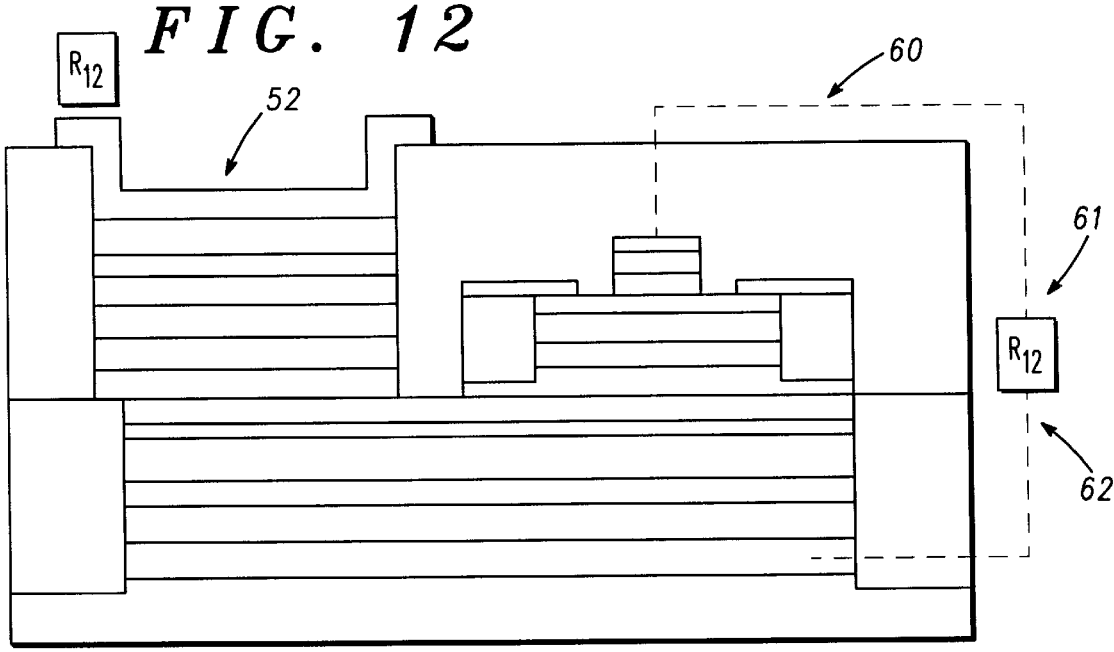
FIG. 12 is a simplified cross-sectional view of another embodiment of an integrated matrix of light emitting devices in accordance with the present invention.

Turning now to FIG. 12, a three color integrated matrix of light emitting devices is illustrated in a simplified cross-sectional view similar to that of FIG. 8. In this embodiment the single color semiconductor light emitting diode is replaced with a multi-color semiconductor device generally designated 60. Device 60 is constructed by forming a second semiconductor light emitting device 61 directly over a first semiconductor light emitting device 62, so that light emitted by device 62 is transmitted through device 61 and light from both devices 61 and 62 is emitted from a common aperture. Semiconductor light emitting devices of this type are disclosed in U.S. Pat. No. 5,483,085, entitled "Multiwavelength LED Devices and Methods of Fabrication", issued on Jan. 8, 1996 and assigned to the same assignee.

Figure 13:
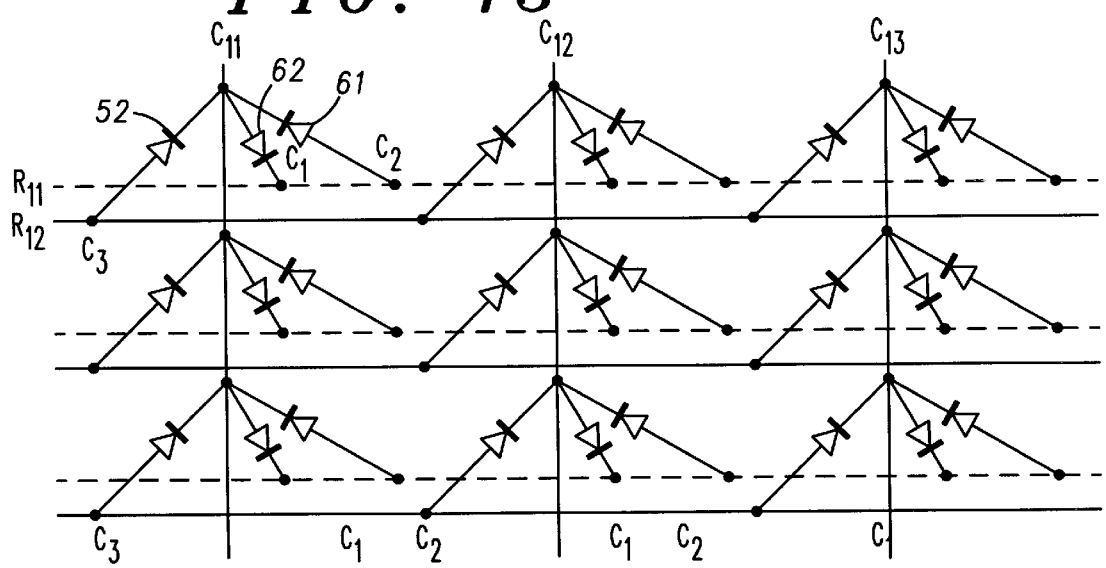
FIG. 13 is a schematic representation of the integrated matrix of light emitting devices illustrated in either of FIG. 12.
Figure 14:
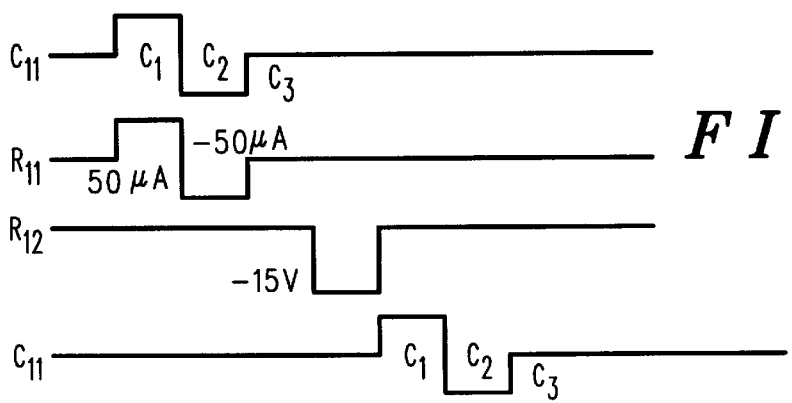
FIG. 14 is a portion of a simplified timing diagram for the operation of the integrated matrix of light emitting devices illustrated schematically in FIG. 13.

A schematic representation of the integrated matrix of light emitting devices, including organic electroluminescent device 52 and semiconductor light emitting devices 61 and 62, is illustrated in FIG. 13. Each organic electroluminescent device 52 has a cathode connected to a column bus C11, C12, etc. and an anode connected to a row bus R12, etc. The semiconductor light emitting device 62 associated with organic electroluminescent device 52 has an anode connected to the same column bus C11 and a cathode connected to an additional row bus R11. Similarly, semiconductor light emitting device 61 associated with organic electroluminescent device 52 has a cathode connected to the same column bus C11 and an anode connected to additional row bus R11. Thus, semiconductor light emitting devices 61 and 62 are addressed by column C11 and row R11 while the associated organic electroluminescent device 52 is addressed by column C11 and row R12. Further, semiconductor light emitting device 61 and 62 are constructed so as to have a common address but require a reverse polarized energization pulse, as illustrated in FIG. 14. By applying pulses as illustrated in FIG. 14 on C11, R11 and R12, all three devices 52, 61, and 62 are activated to produce a desired color of light emission at the pixel.

Figure 15:
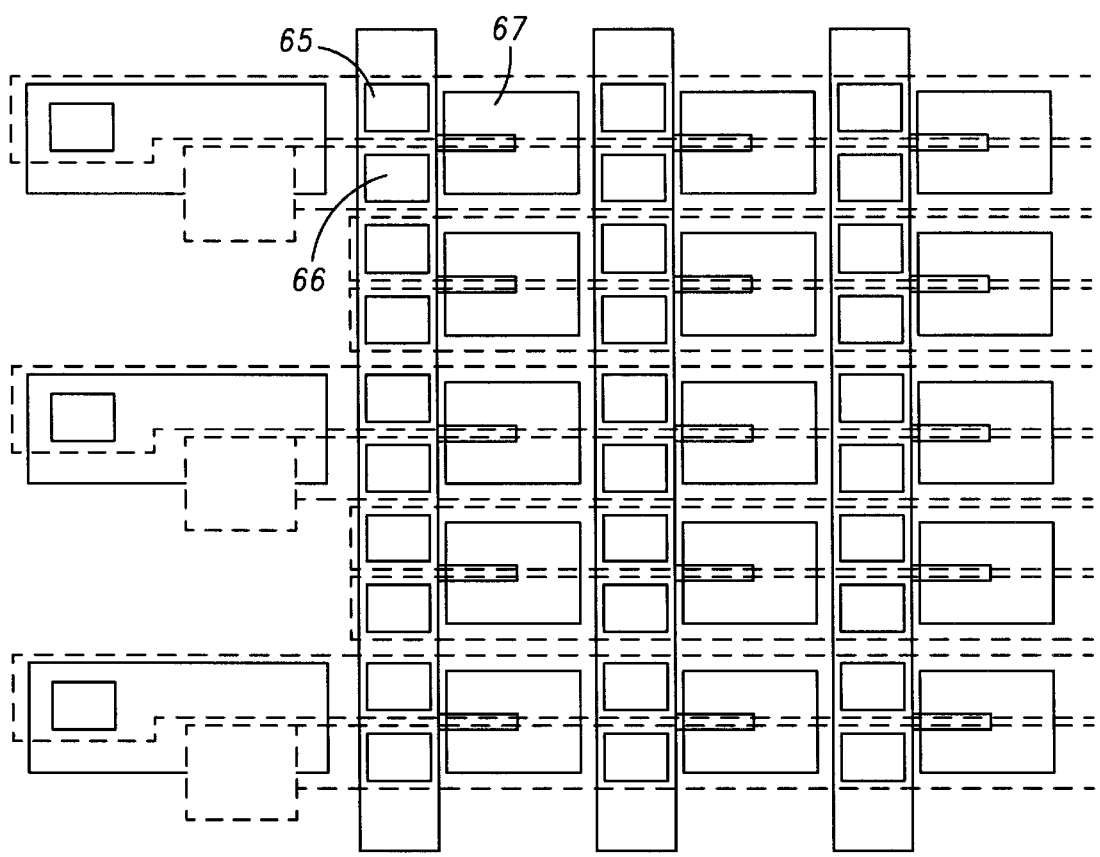
FIG. 15 is a view in top plan of a portion of another embodiment of an integrated matrix of light emitting devices in accordance with the present invention.

Turning to FIG. 15, another embodiment of a three color integrated matrix of light emitting devices is illustrated in a simplified top plan view similar to that of FIG. 9. In this embodiment, two organic electroluminescent devices 65 and 66 which emit light of different wavelengths (e.g. blue and green) are associated with a semiconductor light emitting diode 67 to form a complete pixel. The two organic electroluminescent devices 65 and 66 are constructed in a fashion similar to that described above for the single organic electroluminescent device (device 52 of FIG. 8) except that separate trenches are patterned and filled for each device 65 and 66.

A schematic representation of the integrated matrix of light emitting devices, including organic electroluminescent devices 65 and 66 and semiconductor light emitting device 67, is illustrated in FIG. 16. Each semiconductor light emitting diode (e.g. diode 67) has an anode connected to a column bus C11, C12, etc. and a cathode connected to a row bus R11, etc. The organic electroluminescent device 65 associated with semiconductor light emitting diode 67 has a cathode connected to the same column bus C11 and an anode connected to row bus R11. Similarly, organic electroluminescent device 66 associated with semiconductor light emitting diode 67 has a cathode connected to the same column bus C11 and an anode connected to additional row bus R12. Thus, semiconductor light emitting device 67 and organic electroluminescent device 65 are addressed by column C11 and row R11 while the associated organic electroluminescent device 66 is addressed by column C11 and row R12. Further, organic electroluminescent device 65 and semiconductor light emitting device 67 are constructed so as to have a common address but require a reverse polarized energization pulse, as illustrated in FIG. 17. By applying pulses as illustrated in FIG. 17 on C11, R11 and R12, all three devices 65, 66, and 67 are activated to produce a desired color of light emission at the pixel.

Thus three color integrated matrixes of light emitting devices are disclosed which are relatively easy to manufacture and which have a reduced number of electrical connections so that fewer external terminals are required. Because organic electroluminescent devices are integrated on the same substrate with semiconductor light emitting devices, a wider range of colors is available. Also, as can be seen most clearly in FIG. 15, a much larger percentage of the surface of the structure is light emitting, so that the images produced by this display are much less grainy as a result of this relatively high fill factor.

Thus, various examples of multi-color integrated matrixes of light emitting devices embodying the present invention have been disclosed. The disclosed examples result in a substantial reduction in the external connection pads leading to off-chip drive circuits and the like and substantially reduced dimensions for chips carrying the multi-color integrated matrixes of light emitting devices. Further, the fabrication of the multi-color integrated matrixes of light emitting devices is not substantially increased in complexity and the fill factor is substantially increased. Therefore, the cost is reduced and the reliability is improved while the final image is substantially improved. Further, because of the substantial reduction in size and cost, the resulting displays can be easily incorporated into portable electronic devices.

Throughout this description references to rows and columns are made for simplicity of the disclosure but it will be understood by those skilled in the art that these terms are completely interchangeable since rows and columns of a matrix generally depend upon a physical orientation and are changed, for example, by simply rotating the device 90°. Further, while specific sequences of steps have been disclosed and claimed, it will be understood by those skilled in the art that many of the steps are interchangeable, and the exact sequence utilized depends upon the specific methods applied, including chemicals, temperatures, etc. Further, it should be understood that neither the sequence disclosed nor claimed is intended to in any way limit the present invention to a specific sequence of steps.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated matrix of light emitting devices comprising:

a substrate with a major surface;

a plurality of isolated semiconductor light emitting diodes positioned in a matrix of rows and columns on the substrate;

a plurality of column buses, one each positioned adjacent each column of semiconductor light emitting diodes, each of the column buses being connected to one terminal of each semiconductor light emitting diode in the adjacent column of semiconductor light emitting diodes, each of the column buses providing a planar surface;

a layer of dielectric material overlying the isolated semiconductor light emitting diodes and the plurality of column buses, the layer of dielectric material including trenches formed therein so as to expose portions of each of the plurality of column buses and to define areas for organic electroluminescent devices; and a plurality of organic electroluminescent devices positioned in the defined areas of the trenches and on the planar surface of each column bus with a first terminal of each organic electroluminescent device connected to the column bus.

2. An integrated matrix of light emitting devices as claimed in claim 1 wherein the dielectric material is $SiO_2$.

3. An integrated matrix of light emitting devices as claimed in claim 2, wherein the $SiO_2$ forms a passivation layer on the plurality of isolated semiconductor light emitting diodes.

4. An integrated matrix of light emitting devices as claimed in claim 1 wherein the plurality of organic electroluminescent devices include two organic electroluminescent devices that emit light of a different color for each semiconductor light emitting diode of the plurality of isolated semiconductor light emitting diodes, the two organic electroluminescent devices and the each semiconductor light emitting diode defining a color pixel.

5. An integrated matrix of light emitting devices comprising:

a substrate with a major surface;

a plurality of layers of semiconductor material formed on the substrate including at least a conductive layer of material supported by the major surface of the substrate, a first carrier confinement layer on the conductive layer, an active layer on the first carrier confinement layer, and a second carrier confinement layer on the active layer;

the plurality of layers of material being divided into a plurality of isolated semiconductor light emitting diodes positioned in a matrix of rows and columns with each semiconductor light emitting diode having a first terminal in contact with the conductive layer and a surface terminal;

a plurality of column buses, one each positioned adjacent each column of semiconductor light emitting diodes, each of the column buses being connected to the surface terminal of each semiconductor light emitting diode in the adjacent column of semiconductor light emitting diodes, each of the column buses providing a planar surface; and a plurality of organic electroluminescent devices positioned on the planar surface of each column bus with a first terminal of each organic electroluminescent device connected to the column bus, the plurality of organic electroluminescent devices including a layer of dielectric material overlying the isolated semiconductor light emitting diodes and the plurality of column buses, the layer of dielectric material including trenches formed therein so as to expose portions of each of the plurality of column buses and to define areas for the organic electroluminescent devices, the plurality of organic electroluminescent devices being positioned in the defined areas of the trenches and on the planar surface of each column bus with a first terminal of each organic electroluminescent device connected to the column bus.

6. An integrated matrix of light emitting devices as claimed in claim 5 wherein the dielectric material is $SiO_2$.

7. An integrated matrix of light emitting devices as claimed in claim 6 wherein the $SiO_2$ forms a passivation layer on the plurality of isolated semiconductor light emitting diodes.

8. An integrated matrix of light emitting devices as claimed in claim 5 wherein the plurality of layers of material are divided into a plurality of isolated semiconductor light emitting diodes by impurities residing in the plurality of layers of material so as to separate the plurality of layers of material into a plurality of isolated light emitting diodes positioned in a matrix of rows and columns.

* * * * *